(12) United States Patent
Yamada

(10) Patent No.: US 12,123,892 B2
(45) Date of Patent: Oct. 22, 2024

(54) LASER INTERFEROMETER AND CONTROL METHOD FOR LASER INTERFEROMETER

(71) Applicant: Seiko Epson Corporation, Tokyo (JP)

(72) Inventor: Kohei Yamada, Shiojiri (JP)

(73) Assignee: SEIKO EPSON CORPORATION (JP)

( * ) Notice: Subject to any disclaimer, the term of this patent is extended or adjusted under 35 U.S.C. 154(b) by 131 days.

(21) Appl. No.: 17/412,355

(22) Filed: Aug. 26, 2021

(65) Prior Publication Data

US 2022/0065892 A1    Mar. 3, 2022

(30) Foreign Application Priority Data

Aug. 27, 2020 (JP) .................................. 2020-143298

(51) Int. Cl.
| | |
|---|---|
| *G01P 15/093* | (2006.01) |
| *G02F 1/11* | (2006.01) |
| *G02F 2/00* | (2006.01) |
| *H01S 5/00* | (2006.01) |

(52) U.S. Cl.
CPC .............. *G01P 15/093* (2013.01); *G02F 1/11* (2013.01); *G02F 2/00* (2013.01); *H01S 5/0085* (2013.01)

(58) Field of Classification Search
CPC . G01P 15/093; G02F 1/11; G02F 2/00; H01S 5/0085; G01B 9/0201; G01B 9/02045; G01B 9/02083; G01H 9/00
See application file for complete search history.

(56) References Cited

U.S. PATENT DOCUMENTS

| | | | | |
|---|---|---|---|---|
| 4,289,403 A | * | 9/1981 | Allington ............... | G01N 21/45 359/279 |
| 4,365,181 A | * | 12/1982 | Yamamoto ............. | H03H 9/562 310/365 |
| 4,583,019 A | * | 4/1986 | Yamada ............... | H03H 9/0547 310/318 |
| 5,382,929 A | * | 1/1995 | Inao ................... | H03H 9/02133 333/187 |

(Continued)

FOREIGN PATENT DOCUMENTS

| | | |
|---|---|---|
| JP | H02-038889 A | 2/1990 |
| JP | H09-054293 A | 2/1997 |

(Continued)

OTHER PUBLICATIONS

Simple harmonic motion Graphs of position, velocity and acceleration at: http://physics.bu.edu/~duffy/semester1/c18_SHM_graphs.html.*

*Primary Examiner* — Mohamed K Amara
(74) *Attorney, Agent, or Firm* — Harness, Dickey & Pierce, P.L.C.

(57) ABSTRACT

A laser interferometer includes a light source that emits first laser light, an optical modulator that includes a vibrator and modulates the first laser light by using the vibrator to generate second laser light including a modulated signal, a photodetector that receives interference light between third laser light including a sample signal generated by reflecting the first laser light on an object and the second laser light to output a light reception signal, and a demodulation circuit that performs a demodulation process for demodulating the sample signal from the light reception signal, and the demodulation circuit intermittently performs the demodulation process.

15 Claims, 9 Drawing Sheets

(56) References Cited

U.S. PATENT DOCUMENTS

| | | | | |
|---|---|---|---|---|
| 5,925,968 | A * | 7/1999 | Yachi | H03H 9/0509 |
| | | | | 310/366 |
| 6,061,134 | A * | 5/2000 | Jensen | G01J 3/44 |
| | | | | 356/451 |
| 6,381,015 | B1 * | 4/2002 | Sonehara | G01N 21/45 |
| | | | | 356/497 |
| 8,816,567 | B2 * | 8/2014 | Zuo | H03H 3/02 |
| | | | | 310/365 |
| 9,099,986 | B2 * | 8/2015 | Zuo | H03H 9/02228 |
| 11,668,555 | B2 * | 6/2023 | Yamada | G01B 9/02083 |
| | | | | 356/450 |
| 2008/0100848 | A1 * | 5/2008 | Kobayashi | G01B 9/02009 |
| | | | | 356/497 |
| 2008/0198367 | A1 * | 8/2008 | Chang | G01N 21/4795 |
| | | | | 356/73 |
| 2010/0141954 | A1 * | 6/2010 | Kobayashi | G01B 9/02087 |
| | | | | 356/479 |
| 2010/0149546 | A1 * | 6/2010 | Kobayashi | G01B 11/2441 |
| | | | | 702/167 |
| 2013/0342848 | A1 * | 12/2013 | Nebosis | G01N 21/4795 |
| | | | | 356/479 |
| 2015/0342456 | A1 * | 12/2015 | Yamashita | A61B 3/102 |
| | | | | 351/246 |
| 2019/0391177 | A1 * | 12/2019 | Prater | G01Q 60/34 |
| 2020/0309953 | A1 | 10/2020 | Yamada | |
| 2022/0065612 | A1 * | 3/2022 | Yamada | G01B 9/02083 |
| 2022/0065613 | A1 * | 3/2022 | Kitagawa | G01B 9/02056 |
| 2022/0065614 | A1 * | 3/2022 | Yamada | G01B 9/02083 |
| 2022/0390755 | A1 * | 12/2022 | Yamada | G02B 5/1861 |
| 2022/0390756 | A1 * | 12/2022 | Hayashi | G02B 5/1861 |

FOREIGN PATENT DOCUMENTS

| | | | |
|---|---|---|---|
| JP | 2007-285898 | A | 11/2007 |
| JP | 2020-165700 | A | 10/2020 |

* cited by examiner

| MAXIMUM MODULATION FREQUENCY [MHz] | 0.18 | 0.5 | 1 | 1.5 | 3 | 5 | 10 |
|---|---|---|---|---|---|---|---|
| WAVE NUMBER CORRESPONDING TO TIME DURING WHICH MODULATED SIGNAL IS IN REGION OF ERROR OF 1% OR LESS | 2 | 3 | 5 | 7 | 10 | 13 | 18 |

LASER INTERFEROMETER AND CONTROL METHOD FOR LASER INTERFEROMETER

The present application is based on, and claims priority from JP Application Serial Number 2020-143298, filed Aug. 27, 2020, the disclosure of which is hereby incorporated by reference herein in its entirety.

BACKGROUND

1. Technical Field

The present disclosure relates to a laser interferometer and a control method for the laser interferometer.

2. Related Art

JP-A-2007-285898 discloses a laser vibrometer, as a device for measuring the vibration velocity of an object, that irradiates the object with laser light and measures the vibration velocity based on the scattered laser light subjected to Doppler shift. In the laser vibrometer, the Doppler signal contained in the scattered laser light is extracted by using the optical heterodyne interferometry.

Further, in the laser vibrometer disclosed in JP-A-2007-285898, a piezo element or a quartz crystal resonator of which the vibration frequency is variable by changing the voltage is used, in which frequencies are shifted by irradiating the vibrators with laser light. By using the laser light including the modulated signal of which the frequency is shifted in this way as reference light, the Doppler signal is demodulated from the scattered laser light. By using the Doppler signal obtained in this way, the vibration velocity of the object can be measured.

Further, JP-A-2007-285898 discloses that it is desirable to use a piezo element as a vibrator, which has a property of deforming when a voltage, magnetism, or the like is applied, for example, and whose vibration frequency can be changed by changing the voltage. JP-A-2007-285898 also discloses that the vibration frequency utilizes an optical Doppler shift by the fact that a triangular wave or a sawtooth wave of which the rising of the waveform exhibits linearity has to be used and laser light is incident at the rising of a sawtooth wave applied voltage or at the rising and falling of a triangular wave applied voltage.

However, in general, a vibrator such as a piezo element driven in the kHz band or higher or a quartz crystal resonator having a high Q value uses a simple vibration drive. Therefore, in the driving method using the triangular wave or the sawtooth wave as disclosed in JP-A-2007-285898, the accuracy of the modulated signal may not be obtained, which may make the method impractical. Thus, a driving method that does not use the triangular wave or the sawtooth wave is required to be used.

On the other hand, when a driving method is performed by using a sine wave showing accuracy relatively easily, the velocity of a portion in the vibrator that modulates the laser light tends to change from moment to moment. Therefore, the modulation frequency is changed accordingly. When the frequency of the modulated signal changes in this way, there is a problem that when a sample signal of the Doppler signal or the like from scattered laser light is demodulated, the sample signal cannot be accurately demodulated.

SUMMARY

A laser interferometer according to an application example of the present disclosure includes: a light source that emits first laser light; an optical modulator that includes a vibrator and modulates the first laser light by using the vibrator to generate second laser light including a modulated signal; a photodetector that receives interference light between third laser light including a sample signal generated by reflecting the first laser light on an object and the second laser light to output a light reception signal; and a demodulation circuit that performs a demodulation process for demodulating the sample signal from the light reception signal, in which the demodulation circuit intermittently performs the demodulation process.

A control method for a laser interferometer according to another application example of the present disclosure is a control method for a laser interferometer includes: a light source that emits first laser light; an optical modulator that includes a vibrator and modulates the first laser light by using the vibrator to generate second laser light including a modulated signal; and a photodetector that receives interference light between third laser light including a sample signal generated by reflecting the first laser light on an object and the second laser light to output a light reception signal, the control method including intermittently performing a demodulation process for demodulating the sample signal from the light reception signal.

DESCRIPTION OF EXEMPLARY EMBODIMENTS

Hereinafter, a laser interferometer and a control method for the laser interferometer according to the present disclosure will be described in detail based on the embodiments shown in the accompanying drawings.

1. First Embodiment

First, a laser interferometer according to a first embodiment will be described.

Figure 1:
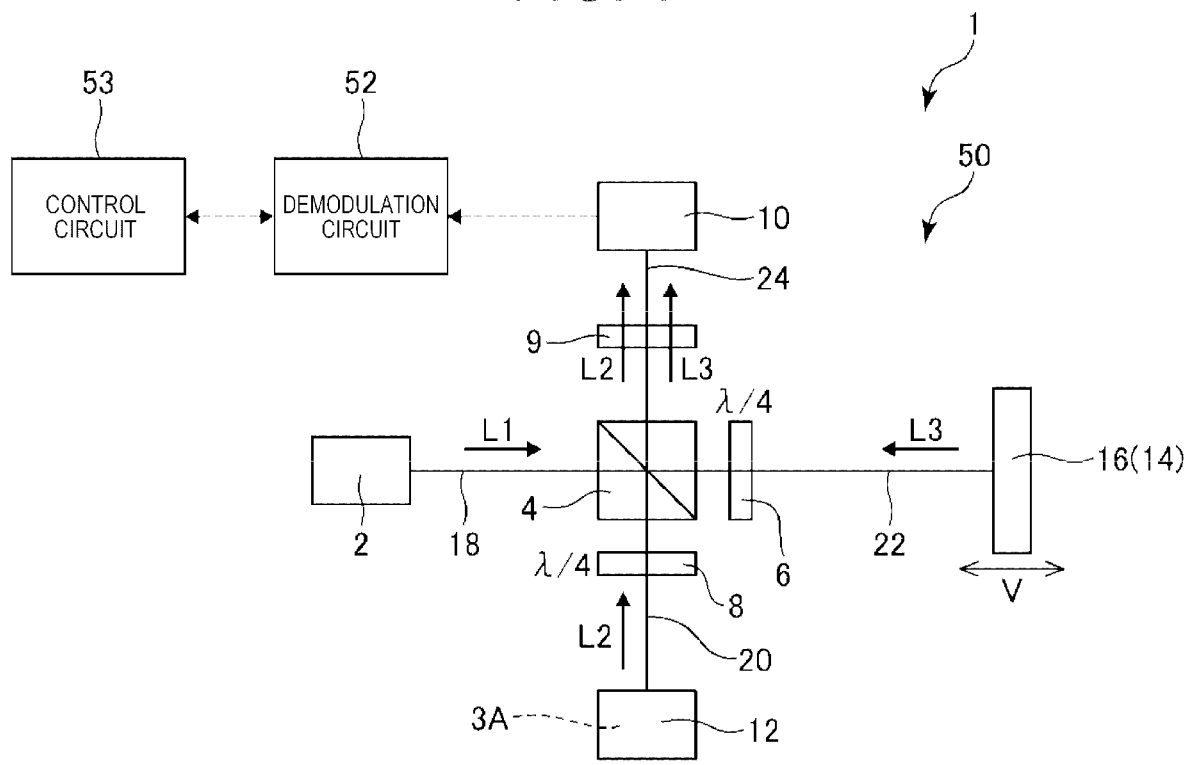
FIG. 1 is a schematic configuration diagram showing a laser interferometer according to the first embodiment.

FIG. 1 is a schematic configuration diagram showing a laser interferometer according to the first embodiment.

A laser interferometer 1 shown in FIG. 1 has an optical system 50, a demodulation circuit 52 into which a signal from the optical system 50 is input, and a control circuit 53.

1.1. Optical System

The optical system 50 includes a light source 2, a polarization beam splitter 4, a quarter wave plate 6, a quarter wave plate 8, an optical analyzer 9, a photodetector 10, a frequency shifter type optical modulator 12, and a set section 16 in which an object 14 to be measured is arranged.

The light source 2 emits emission light L1 (first laser light) having a predetermined wavelength. The photodetector 10 converts the received light into an electric signal. The optical modulator 12 includes a vibrator 3A and modulates the emission light L1 to generate reference light L2 (second laser light) including a modulated signal. The set section 16 is capable of arranging the object 14 to be measured. The emission light L1 incident on the object 14 to be measured is reflected as object light L3 (third laser light) including a sample signal, for example, a frequency signal or a phase signal.

The optical path of the emission light L1 emitted from the light source 2 is referred to as an optical path 18. Further, the optical path 18 is coupled to an optical path 20 by the reflection of the polarization beam splitter 4. On the optical path 20, the quarter wave plate 8 and the optical modulator 12 are arranged in this order from the polarization beam splitter 4 side. Further, the optical path 18 is coupled to an optical path 22 by the transmission of the polarization beam splitter 4. On the optical path 22, the quarter wave plate 6 and the set section 16 are arranged in this order from the polarization beam splitter 4 side.

Further, the optical path 20 is coupled to an optical path 24 by the transmission of the polarization beam splitter 4. On the optical path 24, the optical analyzer 9 and the photodetector 10 are arranged in this order from the polarization beam splitter 4 side.

The emission light L1 emitted from the light source 2 enters the optical modulator 12 via the optical path 18 and the optical path 20. Further, the emission light L1 enters the object 14 to be measured via the optical path 18 and the optical path 22. The reference light L2 generated by the optical modulator 12 enters the photodetector 10 via the optical path 20 and the optical path 24. The object light L3 generated by the reflection from the object 14 to be measured enters the photodetector 10 via the optical path 22 and the optical path 24.

Hereinafter, each section of the laser interferometer 1 will be described in sequence.

1.1.1. Light Source

The light source 2 is a laser light source that emits an emission light L1 with a narrow line width having coherence. When the line width is displayed by frequency difference, a laser light source having a line width of MHz band or less is preferably used. Specifically, gas lasers such as HeNe lasers, and semiconductor lasers such as a distributed feedback-laser diode (DFB-LD), a laser diode with fiber bragg grating (FBG-LD), or a vertical cavity surface emitting laser (VCSEL) can be exemplified. Of these, the semiconductor laser makes it possible to reduce the size of the light source 2.

1.1.2. Polarization Beam Splitter

The polarization beam splitter 4 is an optical element that splits the incident light into transmitted light and reflected light. Further, the polarization beam splitter 4 has a function of transmitting P-polarized light and reflecting S-polarized light, and can divide the polarization state of the incident light into orthogonal components. Hereinafter, a case where the emission light L1 which is linearly polarized light and has a ratio between the P-polarized light and the S-polarized light of, for example, 50:50 is incident on the polarization beam splitter 4 will be considered.

As described above, the polarization beam splitter 4 reflects the S-polarized light of the emission light L1 and transmits the P-polarized light.

The S-polarized light of the emission light L1 reflected by the polarization beam splitter 4 is converted into circularly polarized light at the quarter wave plate 8 and incident on the optical modulator 12. The circularly polarized light of the emission light L1 incident on the optical modulator 12 undergoes a frequency shift of $f_M$ (Hz) and is reflected as the reference light L2. Therefore, the reference light L2 includes a modulated signal having a modulation frequency of $f_M$ (Hz). The reference light L2 is converted into P-polarized light when it passes through the quarter wave plate 8 again. The P-polarized light of the reference light L2 passes through the polarization beam splitter 4 and the optical analyzer 9 and is incident on the photodetector 10.

The P-polarized light of the emission light L1 passing through the polarization beam splitter 4 is converted into circularly polarized light at the quarter wave plate 6 and incident on the object 14 to be measured in a moving state. The circularly polarized light of the emission light L1 incident on the object 14 to be measured undergoes a Doppler shift of $f_d$ (Hz) and is reflected as the object light L3. Therefore, the object light L3 includes a frequency signal having a frequency of $f_d$ (Hz). The object light L3 is converted into the S-polarized light when the object light L3 passes through the quarter wave plate 6 again. The S-polarized light of the object light L3 is reflected by the polarization beam splitter 4, passes through the optical analyzer 9, and is incident on the photodetector 10.

As described above, since the emission light L1 has coherence, the reference light L2 and the object light L3 are incident on the photodetector 10 as interference light.

A non-polarization beam splitter may be used instead of the polarization beam splitter. In this case, since the quarter wave plate 6 and the quarter wave plate 8 are not required, the laser interferometer 1 can be made smaller by reducing the number of parts.

1.1.3. Optical Analyzer

In the optical analyzer 9, since the S-polarized light and the P-polarized light that are orthogonal to each other are independent of each other, interference does not appear by simply superimposing them. Therefore, a light wave obtained by superimposing S-polarized light and P-polarized light is passed through the optical analyzer 9 tilted by 45° with respect to both S-polarized light and P-polarized light. By using the optical analyzer 9, light of the components common to each other can be transmitted to cause interference. As a result, in the optical analyzer 9, interference light having a frequency of $f_M$–$f_d$ (Hz) is generated.

1.1.4. Photodetector

The reference light L2 and the object light L3 are incident on the photodetector 10 via the polarization beam splitter 4 and the optical analyzer 9. Thereby, the reference light L2 and the object light L3 interfere with each other by optical heterodyne, and the interference light having a frequency of $f_M$–$f_d$ (Hz) is incident on the photodetector 10. By demodulating the sample signal such as the frequency signal or the phase signal from the interference light by the method to be described later, the movement of the object 14 to be measured, that is, the velocity, vibration, or displacement can be finally obtained. Examples of the photodetector 10 include a photodiode and the like.

1.1.5. Optical Modulator

Hereinafter, the optical modulator 12 will be described with four configuration examples, which are different from one another in terms of the form of the vibrator.

1.1.5.1. First Configuration Example

Figure 2:
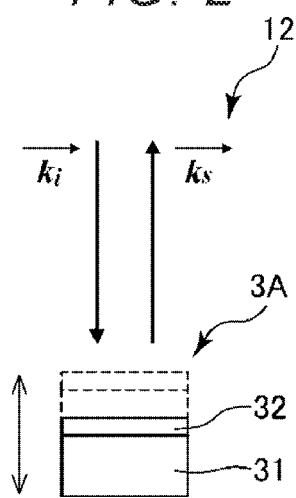
FIG. 2 is a conceptual diagram showing a first configuration example of an optical modulator shown in FIG. 1.

First, a first configuration example of the optical modulator 12 will be described. FIG. 2 is a conceptual diagram showing a first configuration example of the optical modulator 12 shown in FIG. 1.

The optical modulator 12 shown in FIG. 2 includes the vibrator 3A including a piezoelectric element. The piezoelectric element is an element that has the property of being deformed when a voltage is applied, and of which the vibration frequency can be changed by changing the voltage. The vibrator 3A has an element main body 31 which is the piezoelectric element and a light reflecting film 32 provided on the element main body 31.

Since the vibrator 3A has such a piezoelectric element, it is possible to achieve the optical modulator 12 having a simple structure and easy cost reduction.

The element main body 31 shown in FIG. 2 has a vibration mode for stretching vibration in the vertical direction of FIG. 2. The element main body 31 is made of a piezoelectric material. Examples of the piezoelectric material include piezoelectric ceramics such as lead zirconate titanate (PZT), barium titanate and lead titanate, and piezoelectric plastics such as polyvinylidene fluoride.

The light reflecting film 32 is composed of a mirror film that spreads so as to intersect the vibration direction of the element main body 31. Examples of the mirror film include a metal film and a dielectric multilayer film.

As described above, the vibrator 3A generates a simple vibration in the vertical direction of FIG. 2. The simple vibration refers to a reciprocating motion at a predetermined amplitude and a predetermined period. The amplitude and period of the simple vibration are controlled relatively accurately by setting the waveform of the voltage signal applied to the vibrator 3A to a sine wave or a wave having a waveform similar thereto. Therefore, by using the vibrator 3A that generates simple vibration, the vibration velocity of the light reflecting surface can be controlled accurately. This makes it possible to generate a highly accurate and stable modulated signal.

In the vibrator 3A, the upper surface of the light reflecting film 32 is a light reflecting surface that reflects the emission light L1. The vibrator 3A may be an element that performs an in-plane vibration, that is, vibrates in parallel with the light reflecting surface, but in the present embodiment, it is an element that vibrates out of the plane, that is, vibrates in the out-of-plane direction intersecting the light reflecting surface. By using the vibrator 3A that vibrates in the out-of-plane direction, there is an advantage that the optical modulator 12 can be easily miniaturized.

1.1.5.2. Principle of Frequency Shift by Optical Modulator

Next, the principle of frequency shift by the optical modulator 12 will be described; however, prior to the description thereof, the principle of Doppler shift by the object 14 to be measured will be described first.

When the object 14 to be measured moving in the V vector is irradiated with the emission light L1 having a frequency $f_0$, the object 14 to be measured undergoes a frequency shift due to the Doppler effect. Assuming that the frequency shift (Doppler shift) by the object 14 to be measured is $f_d$, the object light L3 having the frequency $f_0+f_d$ is scattered from the object 14 to be measured. The Doppler shift $f_d$ is obtained by the following equation (1).

$$f_d = \frac{1}{2\pi}\left(\vec{k_s} - \vec{k_i}\right)\cdot \vec{V} \tag{1}$$

Here, a case may be considered that the object 14 to be measured is moving at a velocity V along the direction in which the emission light L1 is incident, but in a direction opposite to the incident direction, and the incident emission light L1 is reflected by the object 14 to be measured and reversely travels on the same optical path as the incident light. In this case, since $k_s=-k_i$, the above equation (1) becomes the following equation (2).

$$f_d = \frac{2}{\lambda}\cdot V \tag{2}$$

As is clear from the above equation (2), the Doppler shift $f_d$ is derived in a linear relationship with the velocity V of the object 14 to be measured. Therefore, when the Doppler shift $f_d$ can be obtained with the laser interferometer 1, it is possible to measure the velocity V of the object 14 to be measured in a non-contact manner and without performing calibration work.

Subsequently, the principle of frequency shift by the optical modulator 12 will be described.

When the emission light L1 is incident on the light reflecting film 32 of the optical modulator 12, the emission light L1 undergoes frequency modulation by the Doppler effect to generate reference light L2 including a modulated signal. Assuming that the frequency of the modulated signal is a modulation frequency $f_M$, the modulation frequency $f_M$ is obtained by the following equation (3).

$$f_M = \frac{1}{2\pi}\left(\vec{k_s} - \vec{k_i}\right)\cdot \vec{v} \tag{3}$$

The $k_i$ vector is the wave vector of the emission light L1 incident on the optical modulator 12, and the $k_s$ vector is the wave vector of the scattered light scattered by the optical modulator 12. Since the scattered light can be regarded as the reflected light in the light reflecting film 32, the $k_s$ vector can be regarded as the wave vector of the reflected light. The v vector is the velocity of a light reflecting surface.

Here, the emission light L1 is considered to be vertically incident on the light reflecting surface. In this case, since $k_s=-k_i$, the above equation (3) becomes the following equation (4).

$$f_M = \frac{1}{\pi}\vec{k_s}\cdot\vec{v} = \frac{2v}{\lambda}\cos\theta \quad (4)$$

θ is an angle formed by the traveling direction of the reference light L2 emitted from the optical modulator 12 and the velocity direction of the light reflecting surface. Further, λ is a wavelength of the emission light L1 incident on the light reflecting surface.

Here, a case will be considered where the traveling direction of the reference light L2 and the velocity direction of the light reflecting surface coincide with each other. In this case, since θ=0, the above equation (4) becomes the following equation (5).

$$f_M = \frac{2v}{\lambda} \quad (5)$$

Meanwhile, the velocity of the light reflecting surface will be considered. It is assumed that a displacement amplitude of the light reflecting surface is $L_0$ (m), and the vibration frequency of the light reflecting surface is $f_a$ (Hz). At this time, the position L (m) of the light reflecting surface is obtained by the following equation (6), and the velocity v (m/s) of the light reflecting surface is obtained by the following equation (7).

$$L = L_0 \sin(2\pi f_a t) \quad (6)$$

$$v = 2\pi f_a L_0 \cos(2\pi f_a t) \quad (7)$$

According to the equations (6) and (7), the above-mentioned modulation frequency $f_M$ is obtained by the following equation (8).

$$f_M = \frac{4\pi f_a L_0 \cos\theta}{\lambda}\cos(2\pi f_a t) \quad (8)$$

As can be seen from the above equation (8), the modulation frequency $f_M$ fluctuates depending on the simple vibration of the vibrator 3A. Then, the instantaneous maximum modulation frequency $f_{Mmax}$ is obtained by the following equation (9).

$$f_{Mmax} = \frac{4\pi f_a L_0 \cos\theta}{\lambda} \quad (9)$$

Here, a case will be considered where the traveling direction of the reference light L2 and the maximum velocity direction of the light reflecting surface coincide with each other. In this case, since θ=0 in the equation (9), the maximum modulation frequency $f_{Mmax}$ is obtained by the following equation (10).

$$f_{Mmax} = \frac{4\pi f_a L_0}{\lambda} \quad (10)$$

As described above, in order to increase the maximum modulation frequency $f_{Mmax}$, it is preferable that θ is 0 or a value close to it. Based on this, the vibrator 3A is preferably an element that vibrates out-of-plane rather than an element that vibrates in-plane.

The vibrator 3A can change the displacement amplitude $L_0$ and the vibration frequency $f_a$ by changing the applied voltage and frequency. This makes it possible to adjust the maximum modulation frequency $f_{Mmax}$.

1.1.5.3. Second Configuration Example

Figure 3:
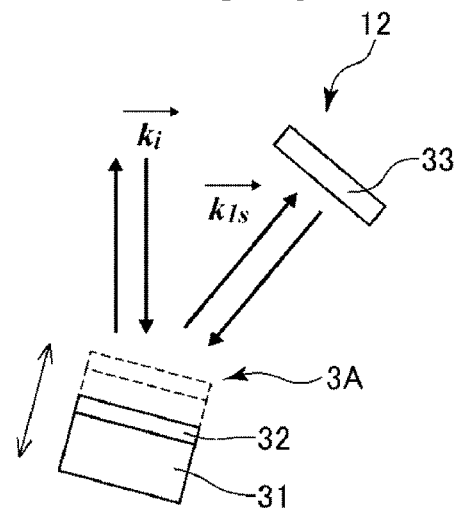
FIG. 3 is a conceptual diagram showing a second configuration example of the optical modulator shown in FIG. 1.

Next, a second configuration example of the optical modulator 12 will be described. FIG. 3 is a conceptual diagram showing a second configuration example of the optical modulator 12 shown in FIG. 1.

Hereinafter, the second configuration example will be described, but in the following description, the differences from the first configuration example will be mainly described, and the description of the same matters will be omitted. In FIG. 3, the same reference numerals are given to the same configurations as those of the above-described configuration example.

The optical modulator 12 shown in FIG. 3 includes the vibrator 3A including the piezoelectric element and a mirror 33.

In the optical modulator 12 shown in FIG. 3, the light of the $k_i$ vector incident on the light reflecting surface of the vibrator 3A is reflected off the light reflecting surface and is incident on the mirror 33 as the light of $k_{1s}$ vector. Since the light of the $k_{1s}$ vector is incident on the mirror 33 at an incident angle of zero, an emission angle is also zero, and the light is incident on the light reflecting surface of the vibrator 3A at the same angle. The light of the $k_{1s}$ vector is reflected off the light reflecting surface again and travels along the same optical path as the light of the $k_1$ vector.

By passing through the mirror 33 in this way, the reference light L2 generated by the optical modulator 12 is subjected to frequency modulation twice. Therefore, by using the mirror 33 together, the frequency modulation of a high frequency becomes possible as compared with the case where the vibrator 3A alone is used.

It is assumed that, of the two reflections by the light reflecting surface described above, the modulation frequency due to the first reflection is set to $f_{M1}$, and the modulation frequency due to the second reflection is set to $f_{M2}$.

$f_0$ is the frequency of the emission light L1, but since there is a relationship of $f_0 \gg f_M$, the modulation frequencies $f_{M1}$ and $f_{M2}$ can be regarded as being equal to $f_M$, as shown in the following equations (11) and (12), respectively.

$$f_{M1} = f_M \quad (11)$$

$$f_{M2} = f_M\left(1 + \frac{f_M}{f_0}\right) \simeq f_M \quad (12)$$

Based on this, the reference light L2 generated by the optical modulator 12 shown in FIG. 3 gives the emission light L1 a frequency shift of the modulation frequency $f_M'$, but the modulation frequency $f_M'$ can be regarded as $2f_M$. Then, $f_M'$ is given by the following equation (13).

$$f_M' = f_{M1} + f_{M2} \simeq 2f_M \quad (13)$$

As a result, it can be seen that in the present configuration example, a higher frequency modulation becomes possible.

In the second configuration example as described above, the same effect as that of the first configuration example can be obtained.

1.1.5.4. Third Configuration Example

Figure 4:
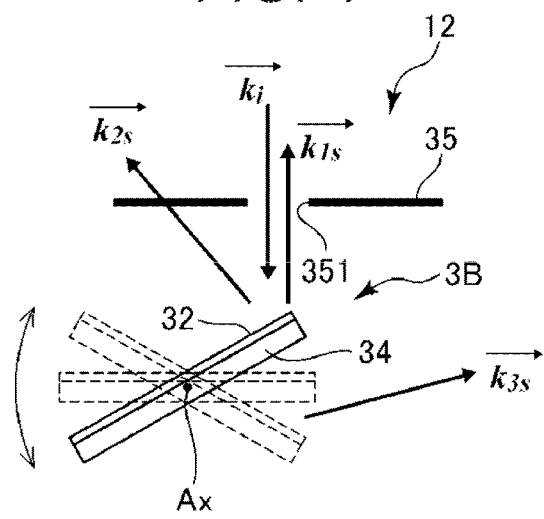
FIG. 4 is a conceptual diagram showing a third configuration example of the optical modulator shown in FIG. 1.

Next, a third configuration example of the optical modulator 12 will be described. FIG. 4 is a conceptual diagram showing the third configuration example of the optical modulator 12 shown in FIG. 1.

Hereinafter, the third configuration example will be described, but in the following description, the differences from the first configuration example will be mainly described, and the description of the same matters will be omitted. In FIG. 4, the same reference numerals are given to the same configurations as those of the above-described configuration example.

The optical modulator 12 shown in FIG. 4 includes a vibrator 3B including a MEMS vibration mirror. MEMS stands for Micro Electro Mechanical Systems. The MEMS vibration mirror includes a movable portion 34 suspended between torsion bars (not shown) and the light reflecting film 32 provided on the surface of the movable portion 34.

The movable portion 34, together with the torsion bar, is formed using MEMS technology. The movable portion 34 makes a reciprocating motion rotating around a rotation shaft Ax with the torsion bar as the rotation shaft Ax. Examples of the method for driving the movable portion 34 include an electromagnetic drive method, an electrostatic drive method, and a piezoelectric drive method.

Meanwhile, since the movable portion 34 makes a rotating reciprocating motion, the light reflecting surface faces various directions with respect to the optical axis of the incident light. Therefore, the light of the $k_1$ vector (emission light L1) incident on the light reflecting surface is scattered in various directions depending on the direction of the light reflecting surface. In FIG. 4, the light of the $k_{1s}$ vector, light of $k_{2s}$ vector, and light of $k_{3s}$ vector are illustrated as examples of light reflected from the light reflecting surface in various directions. All of these correspond to the reference light L2.

Here, in the demodulation process to be described later, the demodulation accuracy of the sample signal can be improved by setting the execution period of the intermittent process in a time section when the vibration velocity of the vibrator 3B is the largest. Therefore, in the case of the vibrator 3B, the vibration velocity is maximum when the light reflecting surface is positioned at the center of the rotation angle width. When the vibration velocity of the light reflecting surface is maximized in this way, light which is formed by reflecting the light of the $k_i$ vector, which is the incident light, and of which the optical path overlaps with the light of the $k_1$ vector, which is the incident light, is referred to as the light of the $k_{1s}$ vector. If the light of the $k_{1s}$ vector can be selectively extracted, other light is less likely to be mixed in, and thus a signal noise ratio (S/N ratio) of the sample signal can be increased in the demodulation process.

The optical modulator 12 shown in FIG. 4 includes a light-shielding portion 35. The light-shielding portion 35 has an opening 351. The light-shielding portion 35 is configured such that the light of the $k_{1s}$ vector to passes through the opening 351 and other light is blocked. Thereby, it is possible to suppress the light having a vector other than the $k_{1s}$ vector, represented by the light of the $k_{2s}$ vector and the light of the $k_{3s}$ vector, entering the photodetector 10. As a result, the component that lowers the S/N ratio of the sample signal is cut by the light-shielding portion 35, and thus a more accurate sample signal can be demodulated.

As long as the light-shielding portion 35 is a member having a light-shielding function, the constituent materials and the like are not limited. Further, instead of the member having the light-shielding function, a member that refracts, reflects, scatters, and so on, resulting in light-shielding, may be used.

As described above, in the present configuration example, the vibrator 3B has the MEMS vibration mirror. According to the configuration, the features of the MEMS vibration mirror can be effectively utilized. That is, the vibrator 3B can be built which is easy to miniaturize, has a sufficiently large drive frequency, and has a large displacement amplitude. As a result, the measurable frequency band or velocity range of the movement of the object 14 to be measured can be sufficiently widened, and a compact and high-performance laser interferometer 1 can be implemented.

Further, in the present configuration example, the optical modulator 12 includes the light-shielding portion 35 that is provided on the optical path of the reference light L2 (second laser light), and blocks some of the reference light L2. In other words, the optical modulator 12 shown in FIG. 4 includes a light-shielding portion 35 that allows the light of the $k_{1s}$ vector shown in FIG. 4 to pass through and blocks the light of the $k_{2s}$ vector and the light of the $k_{3s}$ vector.

According to the configuration, the light of the $k_{1s}$ vector reflected off the light reflecting surface during the time section when the vibration velocity of the vibrator 3B is maximum can be selectively guided to the photodetector 10. Therefore, the demodulation accuracy of the sample signal can be improved.

The MEMS vibration mirror can also change the displacement amplitude $L_0$ and the vibration frequency $f_a$ by changing the voltage and frequency applied to a drive portion that drives the movable portion 34. This makes it possible to adjust the maximum modulation frequency $f_{Mmax}$.

Figure 5:
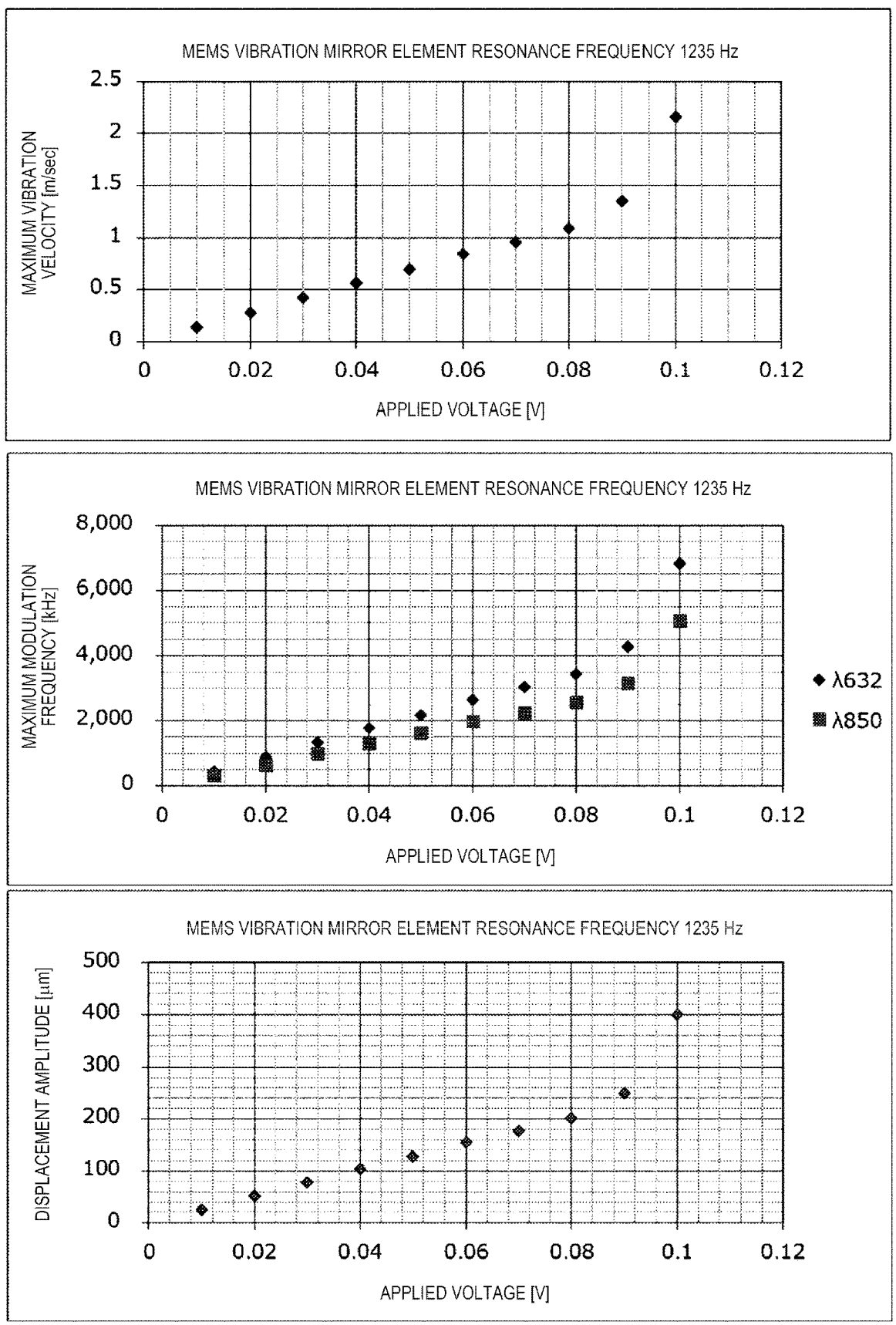
FIG. 5 shows graphs showing a relationship between a voltage applied to a drive portion of a MEMS vibration mirror and measured values of each of a maximum vibration velocity, a maximum modulation frequency, and a displacement amplitude of the MEMS vibration mirror.

FIG. 5 shows graphs showing a relationship between a voltage applied to a drive portion of a MEMS vibration mirror and measured values of each of a maximum vibration velocity, a maximum modulation frequency, and a displacement amplitude of the MEMS vibration mirror. FIG. 5 shows measurement results when the MEMS vibration mirror with the vibration frequency set to 1235 Hz is driven at the resonance frequency. Further, the graph showing the maximum modulation frequency also shows measurement results when light having a wavelength of 632 nm and light having a wavelength of 850 nm are used as the light incident on the MEMS vibration mirror.

In FIG. 5, it is confirmed that as the voltage applied to the drive portion of the MEMS vibration mirror is increased, the measured values of the maximum vibration velocity, the maximum modulation frequency, and the displacement amplitude are all increased. Based on this result, it can be seen that the maximum vibration velocity, maximum modulation frequency and displacement amplitude can be adjusted by changing driving conditions.

In the third configuration example as described above, the same effect as that of the first configuration example can be obtained.

1.1.5.5. Fourth Configuration Example

Figure 6:
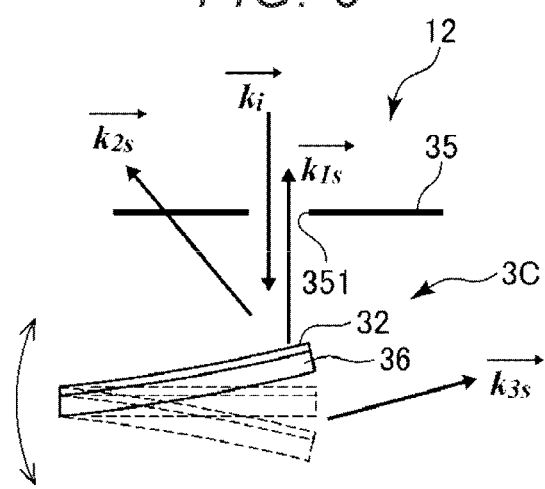
FIG. 6 is a conceptual diagram showing a fourth configuration example of the optical modulator shown in FIG. 1.

Next, a fourth configuration example of the optical modulator 12 will be described. FIG. 6 is a conceptual diagram showing the fourth configuration example of the optical modulator 12 shown in FIG. 1.

Hereinafter, the fourth configuration example will be described, but in the following description, the differences from the third configuration example will be mainly described, and the description of the same matters will be omitted. In FIG. 6, the same reference numerals are given to the same configurations as those of the above-described configuration example.

The optical modulator 12 shown in FIG. 6 includes a vibrator 3C having a vibrating piece 36 including a silicon resonator or a quartz crystal resonator. As shown in FIG. 6, the vibrating piece 36 is a so-called cantilever type vibrating piece arranged so that one end is supported and the other end is a free end. Further, the vibrating piece 36 is provided with the light reflecting film 32.

The vibrating piece 36 including a silicon resonator is driven by a drive portion (not shown) and make bending vibration in the thickness direction. Examples of the driving method of the drive portion include an electromagnetic drive method, an electrostatic drive method, and a piezoelectric drive method.

On the other hand, the vibrating piece 36 including the quartz crystal resonator makes bending vibration in the thickness direction due to the inverse piezoelectric effect exhibited by the quartz crystal.

Since the vibrating piece 36 makes a bending reciprocating motion, the light reflecting surface faces various directions with respect to the optical axis of the incident light, and therefore the light of the $k_1$ vector (emission light L1) incident on the light reflecting surface is scattered in various directions depending on the direction of the light reflecting surface. In FIG. 6, the light of the $k_{1s}$ vector, light of $k_{2s}$ vector, and light of $k_{3s}$ vector are illustrated as examples of light reflected from the light reflecting surface in various directions. All of these correspond to the reference light L2.

The optical modulator 12 shown in FIG. 6 includes the light-shielding portion 35. The light-shielding portion 35 has an opening 351. The light-shielding portion 35 is configured such that the light of the $k_{1s}$ vector to passes through the opening 351 and other light is blocked. Thereby, it is possible to suppress the light having a vector other than the $k_{1s}$ vector, represented by the light of the $k_{2s}$ vector and the light of the $k_{3s}$ vector, entering the photodetector 10. As a result, the component that lowers the S/N ratio of the sample signal is cut by the light-shielding portion 35, and thus a more accurate sample signal can be demodulated.

The silicon resonator and the quartz crystal resonator can also change the displacement amplitude $L_0$ and the vibration frequency $f_a$ by changing the voltage and frequency applied to the drive portion or electrodes. This makes it possible to adjust the maximum modulation frequency $f_{Mmax}$.

As described above, in the present configuration example, the vibrator 3C has the silicon resonator or the quartz crystal resonator. According to the configuration described above, the features of the silicon resonator and the quartz crystal resonator can be effectively utilized. That is, the vibrator 3C can be built which is easy to miniaturize, has a sufficiently large drive frequency, and has a large displacement amplitude. As a result, the measureable frequency band or velocity range of the movement of the object 14 to be measured can be sufficiently widened, and a compact and high-performance laser interferometer 1 can be implemented.

In the fourth configuration example as described above, the same effect as that of the first configuration example can be obtained.

1.2. Demodulation Circuit

The demodulation circuit 52 performs a demodulation process for demodulating a sample signal of a frequency signal, a phase signal, or the like from the light reception signal output from the photodetector 10. The method for demodulating the sample signal is not particularly limited, and examples thereof include a known orthogonal detection method. The orthogonal detection method is a method of performing the demodulation process on the light reception signal by performing an operation of mixing signals orthogonal to each other from the outside with respect to the light reception signal.

Figure 7:
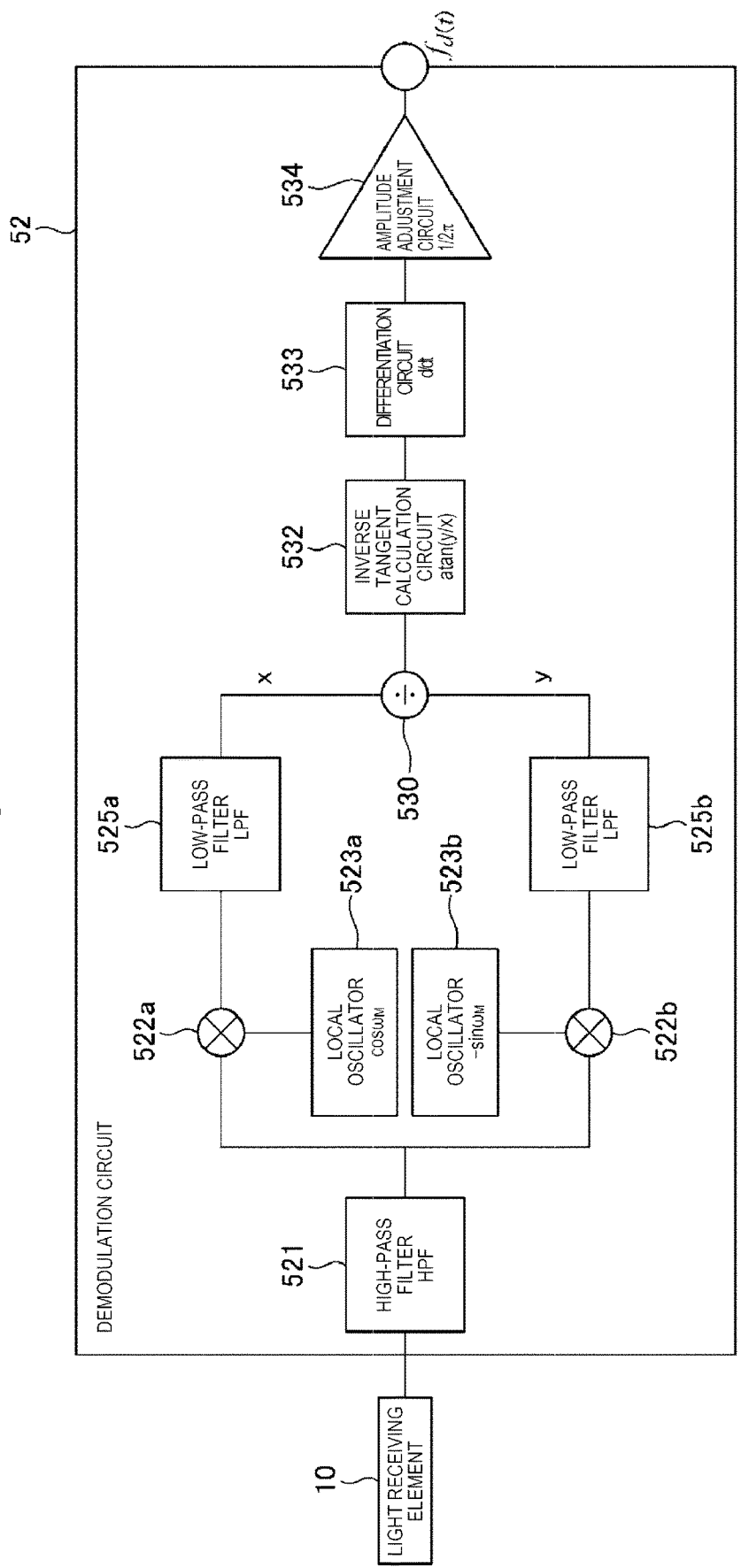
FIG. 7 is a block diagram showing a demodulation circuit that performs a demodulation process by an orthogonal detection method.

FIG. 7 is a block diagram showing a demodulation circuit that performs a demodulation process by an orthogonal detection method. The configuration of the demodulation circuit shown in FIG. 7 is a circuit configuration of a known digital circuit, and is used to demodulate a frequency signal from the light reception signal based on the light modulated by using the optical modulator such as an acoustic optical element (AOM) of which the modulation frequency does not change.

The demodulation circuit 52 shown in FIG. 7 includes a high-pass filter 521, multipliers 522a and 522b, local oscillators 523a and 523b, low-pass filters 525a and 525b, a divider 530, an inverse tangent calculation circuit 532, a differentiation circuit 533, and an amplitude adjustment circuit 534.

In the demodulation process, first, the light reception signal output from the photodetector 10 passes through a high-pass filter 521 to remove the DC component, and then is divided into two. The one divided part of the light reception signal is multiplied by an oscillation frequency signal $\cos \omega_M t$ output from the local oscillator 523a in the multiplier 522a. The other divided part of the light reception signal is multiplied by an oscillation frequency signal $-\sin \omega_M t$ output from the local oscillator 523b in the multiplier 522b. The oscillation frequency signal $\cos \omega_M t$ and the oscillation frequency signal $-\sin \omega_M t$ are signals that are 90° out of phase with each other.

The light reception signal that has passed through the multiplier 522a passes through the low-pass filter 525a and then is input to the divider 530 as a signal x. The light reception signal that has passed through the multiplier 522b also passes through the low-pass filter 525b and then is input to the divider 530 as a signal y. The divider 530 divides the signal y by the signal x, passes the signal y/x through the inverse tangent calculation circuit 532, and obtains a signal atan(y/x).

Then, a sample signal $f_d(t)$, which is a frequency signal, is obtained by passing the signal atan(y/x) through the differentiation circuit 533 and the amplitude adjustment circuit 534.

Although the circuit configuration of the demodulation circuit 52 has been described above, the circuit configuration of the above digital circuit is an example and is not limited thereto. Further, the demodulation circuit 52 is not limited to a digital circuit, and may be an analog circuit. The analog circuit may include a frequency voltage (F/V) converter circuit and a AZ counter circuit. In the case of frequency demodulation, an analog circuit has an advantage that the resolution can be easily increased.

The circuit configuration of the demodulation circuit 52 described above is a circuit configuration for outputting frequency information, but may be a circuit configuration for outputting phase information. By using the phase information, a displacement meter that obtains the displacement of the object 14 to be measured is built.

1.3. Control Circuit

The control circuit 53 performs various operations on the sample signal $f_d(t)$ output from the demodulation circuit 52. As a result of this operation, a final output signal of the laser interferometer 1 is obtained.

Here, as described above, the aforementioned demodulation process is a process for demodulating the sample signal from the light reception signal based on the light modulated by using the optical modulator of which the modulation frequency does not change. However, since the vibrators 3A to 3C make a reciprocating vibration, the modulation frequency changes. Therefore, when the above demodulation process is performed on the light reception signal based on the light including the reference light L2 modulated by the optical modulator 12 including the vibrators 3A to 3C, there is a limitation that an accurate sample signal can not be extracted.

Therefore, in the present embodiment, the demodulation circuit 52 performs the demodulation process intermittently. Specifically, the control circuit 53 performs a process of extracting a signal for a part of the period on the sample signal $f_d(t)$ output from the demodulation circuit 52.

The period for extracting the sample signal $f_d(t)$ is defined as the "execution period of the demodulation process". In the execution period, a period during which the velocity of the light reflecting surface that is simply vibrating can be regarded as substantially constant is set. In the execution period, the modulation frequency can be regarded as substantially constant. Therefore, in the control circuit 53, more accurate Doppler shift information can be obtained by extracting the signal output during the execution period from the sample signal $f_d(t)$ output from the demodulation circuit 52.

In the present specification, the process for extracting a signal for a part of the period from the sample signal $f_d(t)$ is described, but the "intermittent demodulation process" also includes an operation mode in which the demodulation circuit 52 intermittently outputs the sample signal $f_d(t)$.

Figure 8:
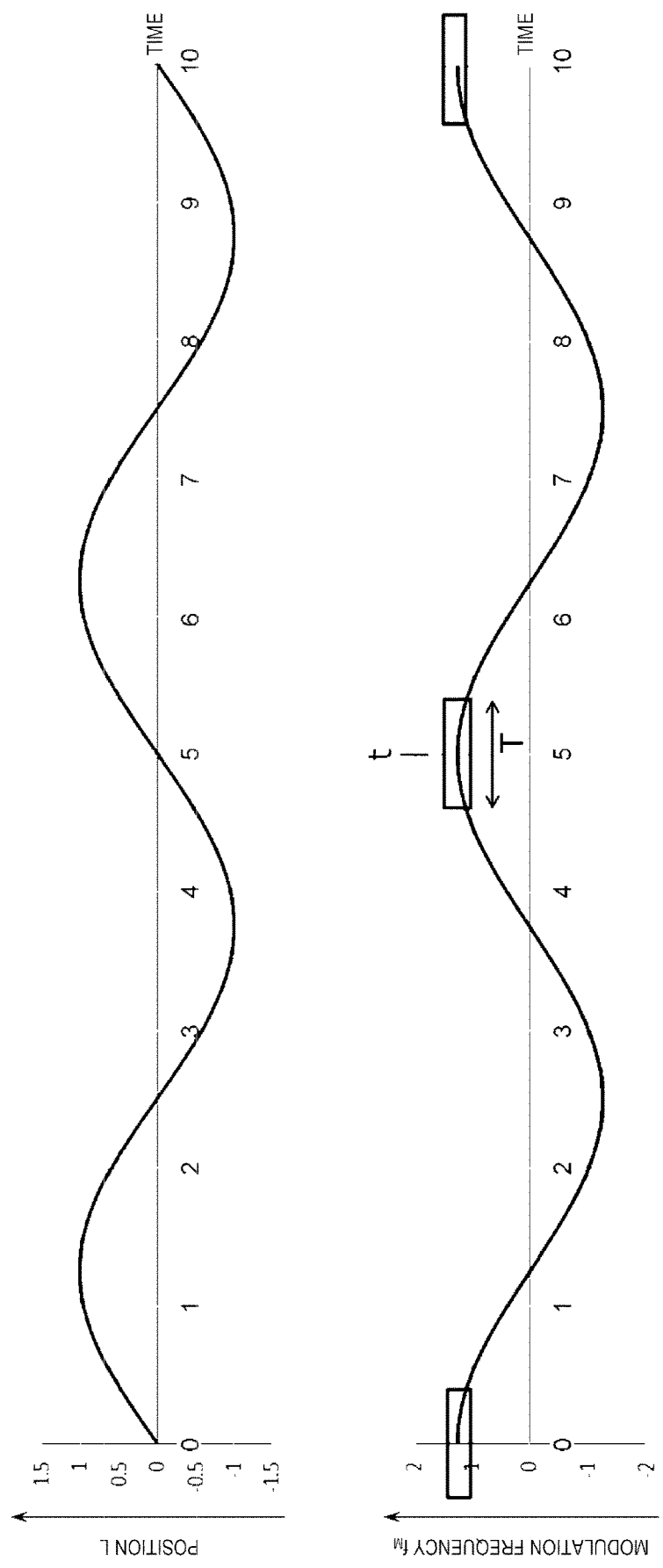
FIG. 8 is a graph showing a change in a position of a light reflecting surface provided on a vibrator that simply vibrates over time, and a graph showing a change in a modulation frequency by the vibrator over time.

FIG. 8 is a graph showing a change in a position L of a light reflecting surface provided on the vibrator 3B that simply vibrates over time, and a graph showing a change in the modulation frequency $f_M$ by the vibrator 3B over time. In FIG. 8, the vibrator 3B is given as an example, but the same applies to the other vibrators 3A and 3C.

The position L of the light reflecting surface shown in FIG. 8 is given by the above-mentioned equation (6). Further, the modulation frequency $f_M$ shown in FIG. 8 is given by the above-mentioned equation (8). Therefore, both the change in the position L of the light reflecting surface over time and the change in the modulation frequency $f_M$ over time are represented by trigonometrical functions. Therefore, the modulation frequency $f_M$ can be regarded as substantially constant in a time section T during which the maximum is reached.

Thus, the control circuit 53 specifies a time t at which the maximum modulation frequency is reached and the time section T having a predetermined width including the time t, based on the modulation frequency $f_M$. Then, the control circuit 53 extracts the sample signal $f_d(t)$ output from the demodulation circuit 52 during the time section T. By performing the processing, the Doppler shift information can be obtained with high accuracy. It can be said that this time section T is the time section in which the instantaneous vibration velocity of the vibrator 3B is the largest.

Figure 9:
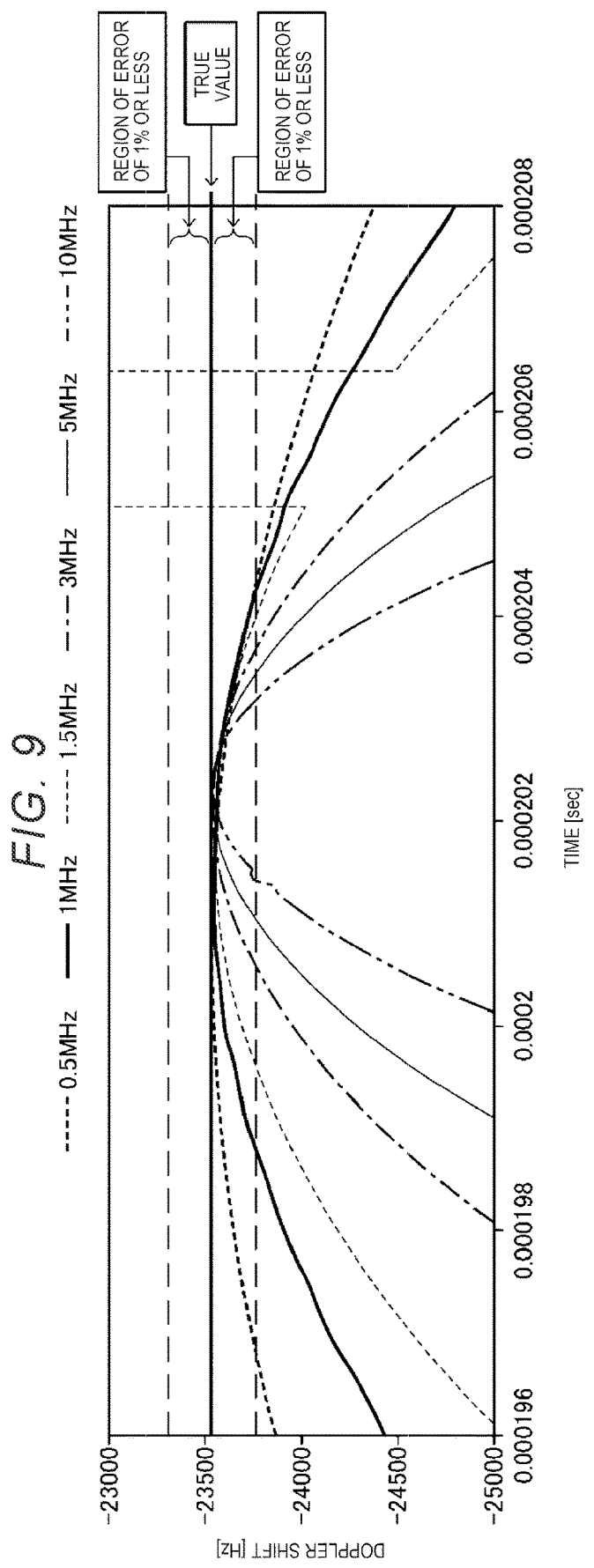
FIG. 9 is a graph showing a change in Doppler shift output from a demodulation circuit over time when laser light is applied to an object to be measured moving at a constant velocity.

FIG. 9 is a graph showing a change in the Doppler shift $f_d$ output from the demodulation circuit 52 over time when laser light is applied to an object to be measured moving at a constant velocity.

In the example of FIG. 9, the velocity of the object to be measured is 10 mm/sec. This velocity is 23.5 kHz when converted to Doppler shift. Therefore, in FIG. 9, the Doppler shift value of −23500 Hz is the true value. Further, in FIG. 9, a region of an error of 1% or less with respect to this true value is shown. It can be said that when a measurement result is contained inside the region, the accuracy of the measurement result is sufficient.

Further, in FIG. 9, measurement results when the maximum modulation frequency of the vibrator 3B used for the measurement are changed are each shown. The maximum modulation frequency is 0.5 MHz, 1 MHz, 1.5 MHz, 3 MHz, 5 MHz, and 10 MHz from the lowest. For the above-mentioned oscillation frequency signal cos $\omega_M$ and oscillation frequency signal −sin $\omega_M$ required for deriving the measurement results, the value of each maximum modulation frequency described above is used.

As shown in FIG. 9, there is a time section in which a measurement result close to a true value can be obtained at any maximum modulation frequency. Further, the time during which the measurement result is in the region of an error of 1% or less varies depending on the maximum modulation frequency, but a certain time is secured for each. Therefore, it can be said that, by extracting this time section in the control circuit 53, measurement with sufficiently high accuracy can be performed.

Further, the lower the maximum modulation frequency, the longer the time during which the measurement result is in the region of an error of 1% or less. However, if the maximum modulation frequency is too low, the accuracy of the measurement result may decrease. Although not shown in FIG. 9, when the maximum modulation frequency is set to 0.18 MHz, a decrease in measurement accuracy is confirmed.

Figures 10, 11:
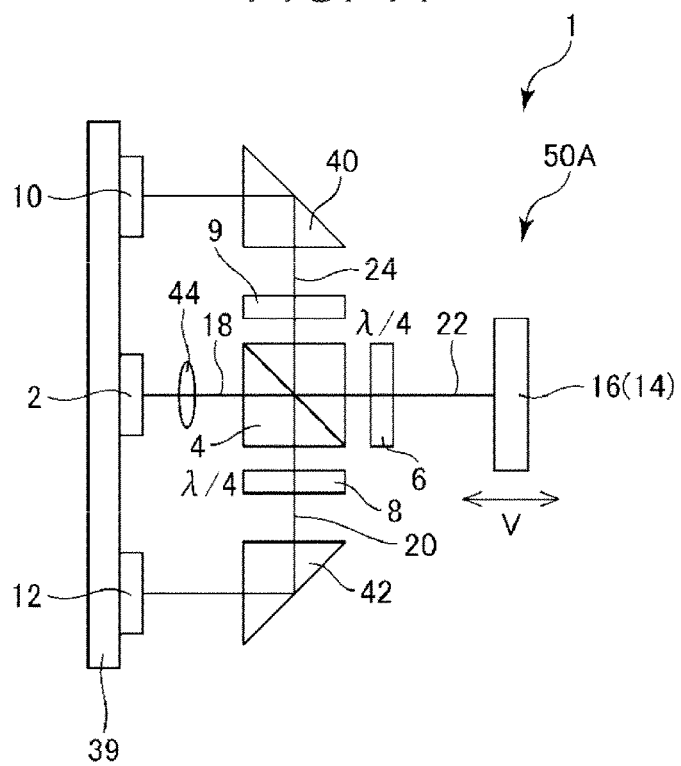
FIG. 10 is a table showing a relationship between a wave number corresponding to a time during which a modulated signal included in reference light modulated by the vibrator is in a region of an error of 1% or less shown in FIG. 9 and a maximum modulation frequency of the vibrator.
FIG. 11 is a schematic configuration diagram showing an example of a mounting structure of an optical system included in a laser interferometer according to a second embodiment.

Therefore, considered is a relationship between a wave number corresponding to a time during which a modulated signal included in the reference light L2 modulated by the vibrator is in a region of an error of 1% or less shown in FIG. 9 and a maximum modulation frequency of the vibrator. FIG. 10 is a table showing the relationship between the wave number and the maximum modulation frequency.

As shown in FIG. 10, when the maximum modulation frequency is 0.18 MHz, the wave number is 2. In this case, since the accuracy of the measurement result was confirmed as described above, it is preferable that the wave number is 3 or more based on the accuracy. On the other hand, when the maximum modulation frequency is 0.5 MHz or more, the wave number is 3 or more in each case. When the maximum modulation frequency is in this range, sufficient measurement accuracy is obtained as shown in FIG. 9. Therefore, it can be said that the wave number is preferably 3 or more.

As described above, the laser interferometer 1 according to the present embodiment includes the light source 2, the optical modulator 12, the photodetector 10, and the demodulation circuit 52. The light source 2 emits the emission light L1 (first laser light). The optical modulator 12 includes the vibrators 3A to 3C, and modulates the emission light L1 using the vibrators 3A to 3C to generate the reference light L2 (second laser light) including a modulated signal. The photodetector 10 receives interference light between the object light L3 (third laser light) including a sample signal generated by reflecting the emission light L1 on the object 14 to be measured (object) and the reference light L2. The demodulation circuit 52 performs a demodulation process for demodulating a sample signal from the light reception signal output from the photodetector 10. Then, the demodulation circuit 52 intermittently performs the demodulation process.

According to such a configuration, since the demodulation process by the demodulation circuit 52 is performed intermittently, for example, by optimizing the execution period of the intermittent process, more accurate demodulation of the sample signal becomes possible. For example, the demodulation accuracy of the sample signal can be improved by setting, as the execution period, a time section when the vibration velocities of the vibrators 3A to 3C are the largest. As a result, it is possible to realize a laser interferometer 1 that can be used for highly accurate displacement measurement and velocity measurement while using low-cost and simple elements such as vibrators 3A to 3C.

Further, the control method for the laser interferometer 1 according to the present embodiment is a method for controlling the laser interferometer 1 including the light source 2, the optical modulator 12, and the photodetector 10. The control method includes intermittently performing a demodulation process for demodulating a sample signal from the light reception signal output from the photodetector 10.

According to such a control method, since the demodulation process is performed intermittently, for example, by optimizing the execution period of the intermittent process, more accurate demodulation of the sample signal becomes possible. For example, the demodulation accuracy of the sample signal can be improved by setting, as the execution period, a time section when the vibration velocities of the vibrators 3A to 3C are the largest. As a result, it is possible to realize a laser interferometer 1 that can be used for highly accurate displacement measurement and velocity measurement while using low-cost and simple elements such as vibrators 3A to 3C.

Therefore, the laser interferometer 1 as described above has features such as small size, low cost, high S/N ratio, high accuracy, and wide band. By providing such a laser interferometer 1, it is possible to realize a non-contact vibration measuring device having these features, a vibration control system using the non-contact vibration measuring device, a non-contact ranging device, a displacement meter, a velocimeter, and the like.

Further, in the demodulation circuit 52 according to the present embodiment, it is preferable that the execution period of the demodulation process includes the time section T in which the vibration velocities of the vibrators 3A to 3C are the largest.

By performing the demodulation process intermittently including such an execution period, the demodulation error of the sample signal can be suppressed to a small level. As a result, it is possible to realize a laser interferometer 1 that can be used for highly accurate displacement measurement and velocity measurement while using low-cost and simple elements such as vibrators 3A to 3C.

Further, if the execution period is too short, the measurable time may decrease. Further, if the wave number included in the execution period decreases, the measurement accuracy may decrease. From this point of view, in the demodulation circuit 52, it is preferable that the execution period of the demodulation process is a length including three or more waves of the modulated signal.

By performing the demodulation process intermittently including such an execution period, it is possible to perform demodulation with sufficiently high accuracy, for example, with an error of 1% or less. As a result, it is possible to realize a laser interferometer 1 that can be used for highly accurate displacement measurement and velocity measurement while using low-cost and simple elements such as vibrators 3A to 3C.

In particular, it is more preferable that the execution period of the demodulation process is a length including 10 or more waves of the modulated signal.

In this case, a comparator or a fast Fourier transform circuit (FFT circuit) can be used in the demodulation circuit 52. Thereby, the circuit configuration of the demodulation circuit 52 can be simplified. As a result, the laser interferometer 1 can be made smaller.

The execution period of the demodulation process may be set based on the vibration velocities of the vibrators 3A to 3C instead of using the wave number as a reference. As an example, it is preferable that the execution period of the demodulation process is a time section including the time when the vibrators 3A to 3C reach the maximum vibration velocity and satisfying that the vibration velocity is 90% or more of the maximum vibration velocity. In this case as well, the same effect as described above can be obtained.

Based on the above examination results, the preferable specifications of the vibrators 3A to 3C are as follows.
  a. The maximum modulation frequency is preferably 100 kHz or higher.
  b. The wave number of the modulated signal includes three or more waves in the execution period of the demodulation process.

By satisfying these specifications, the following effects can be obtained.
  a. The range of frequencies and velocities that can be measured for the object 14 to be measured can be expanded.
  b. It is possible to suppress a decrease in measurement accuracy due to insufficient wave number.

Further, in order to satisfy the above specifications, as an example, when the vibration frequency $f_a$ is 800 Hz or more, it is preferable to select a vibrator having a displacement amplitude $L_0$ of 250 μm or more. On the other hand, when the vibration frequency $f_a$ is less than 800 Hz, it is preferable to select a vibrator having a displacement amplitude $L_0$ of 25 μm or more and less than 250 μm.

Therefore, from the viewpoint of easily satisfying the above specifications, a MEMS vibration mirror, a silicon resonator, or a quartz crystal resonator is particularly preferably used for the optical modulator 12.

A part or all of the demodulation circuit 52 and the control circuit 53 is composed of hardware having a processor for processing information, a memory for storing programs and data, and an external interface. The processor realizes each function of the demodulation circuit 52 and the control circuit 53 by reading and executing various programs and data stored in the memory.

Further, some or all of the functions of the demodulation circuit 52 and the control circuit 53 may be realized by hardware such as large scale integration (LSI), an application specific integrated circuit (ASIC), and a field-programmable gate array (FPGA).

2. Second Embodiment

Next, a laser interferometer according to a second embodiment will be described.

Figure 12:
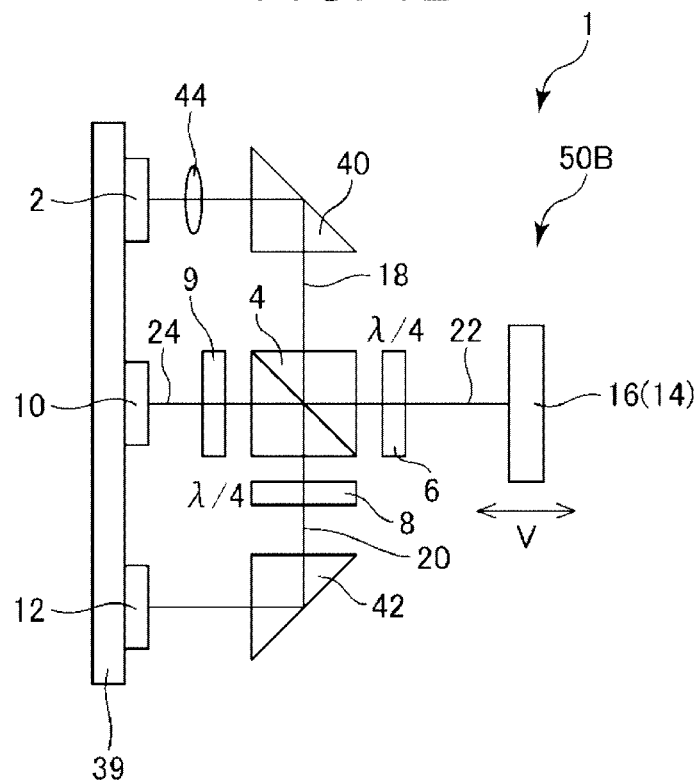
FIG. 12 is a schematic configuration diagram showing an example of a mounting structure of an optical system included in the laser interferometer according to the second embodiment.
Figure 13:
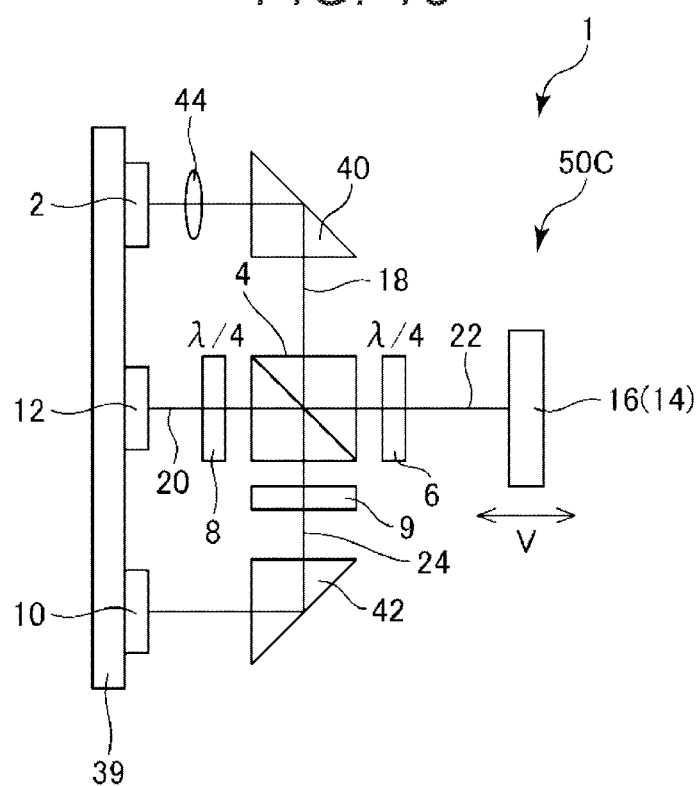
FIG. 13 is a schematic configuration diagram showing an example of a mounting structure of an optical system included in the laser interferometer according to the second embodiment.

FIGS. 11 to 13 are each schematic configuration diagrams showing an example of a mounting structure of an optical system included in a laser interferometer according to the second embodiment.

Hereinafter, the second embodiment will be described, but in the following description, the differences from the first embodiment will be mainly described, and the description of the same matters will be omitted. In FIGS. 11 to 13, the same reference numerals are given to the same configurations as those of the above-described embodiment.

An optical system 50A of a laser interferometer 1 shown in FIG. 11 includes a substrate 39. A light source 2, an optical modulator 12, and a photodetector 10 are each mounted on a substrate 39. The photodetector 10, the light source 2, and the optical modulator 12 are arranged on the substrate 39 in this order along the direction orthogonal to an optical path 22 shown in FIG. 11.

Further, the optical system 50A shown in FIG. 11 includes prisms 40 and 42. The prism 40 is provided on an optical path 24 between the photodetector 10 and an optical analyzer 9. The prism 42 is provided on an optical path 20 between the optical modulator 12 and a quarter wave plate 8.

Further, the optical system 50A shown in FIG. 11 includes a convex lens 44. The convex lens 44 is provided on an optical path 18 between the light source 2 and a polarization beam splitter 4. By providing the convex lens 44, emission light L1 emitted from the light source 2 can be focused and effectively used.

An optical system 50B of a laser interferometer 1 shown in FIG. 12 is the same as the optical system 50A except that the arrangement of the elements is different.

On a substrate 39 shown in FIG. 12, a light source 2, a photodetector 10, and an optical modulator 12 are arranged in this order in the direction orthogonal to an optical path 22 shown in FIG. 12. A prism 40 is provided on an optical path 18, and a prism 42 is provided on an optical path 24.

An optical system 50C of a laser interferometer 1 shown in FIG. 13 has an arrangement in which an optical modulator 12 is incorporated in an optical path connecting an object 14 to be measured and a photodetector 10.

On a substrate 39 shown in FIG. 13, a light source 2, an optical modulator 12, and a photodetector 10 are arranged in this order in the direction orthogonal to an optical path 22 shown in FIG. 13. A prism 40 is provided on an optical path 18, and a prism 42 is provided on an optical path 24.

According to the mounting structures shown in FIGS. 11 to 13 as described above, the size of the laser interferometer 1 can be easily reduced. The arrangement of the elements is not limited to the arrangement shown in the drawings.

In the mounting structures shown in FIGS. 11 to 13, the size of the photodetector 10 is, for example, 0.1 mm square, the size of the light source 2, is, for example, 0.1 mm square, and the size of the optical modulator 12 is, for example, 0.5 to 10 mm square. The size of the substrate 39 on which these elements are mounted is, for example, 1 to 10 mm square. Thereby, the size of the laser interferometer 1 can be reduced to about the size of the substrate 39.

In the second embodiment as described above, the same effect as that of the first embodiment can be obtained.

Although the laser interferometer and the control method for the laser interferometer according to the present disclosure have been described above based on the illustrated embodiment, the laser interferometer according to the present disclosure is not limited to the above-described embodiment, and the configuration of each section can be replaced with any configuration having the same function. Further, any other component may be added to the laser interferometer according to the embodiment.

What is claimed is:

1. A laser interferometer comprising:
   a light source that emits first laser light toward an object;
   an optical modulator that includes a vibrator, a light-shielding structure, and a light reflecting surface on the vibrator, the optical modulator being configured to receive the first laser light via an opening of the light-shielding structure and modulate the first laser light by using the vibrator to generate second laser light including a modulated signal, the second laser light being generated by vibration of the vibrator and reflecting the first laser light from the light reflecting surface, the modulated signal having a modulation frequency corresponding to the vibration of the vibrator;
   a photodetector that receives interference light between third laser light and the second laser light to output a light reception signal, the third laser light including a sample signal that is generated by the first laser light on the object; and
   a demodulation circuit that performs a demodulation process for demodulating the sample signal from the light reception signal, wherein
   the vibrator is configured to perform a reciprocating motion rotating around a rotation axis of a torsion bar such that the light reflecting surface faces various directions with respect to a first optical axis of the first laser light,
   the opening of the light-shielding structure selectively passes the second laser light toward the photodetector as selectively passed second laser light,
   the selectively passed second laser light has a second optical axis aligned with the first optical axis of the first laser light,
   the photodetector only receives the selectively passed second laser light,
   the demodulation circuit selectively repeatedly performs the demodulation process during only an execution period,
   the execution period corresponds to a period of time during which each crest of each waveform in the modulation frequency has a highest value and values that are substantially the same as the highest value,
   a velocity of the light reflecting surface is substantially constant during the execution period, and
   an instantaneous vibration velocity of the vibrator is the largest during the execution period.

2. The laser interferometer according to claim 1, wherein the vibrator is an element that generates simple vibration.

3. The laser interferometer according to claim 2, wherein the vibrator has a piezoelectric element.

4. The laser interferometer according to claim 3, wherein the execution period of the demodulation process corresponds to the period of time in which a vibration velocity of the vibrator is maximum.

5. The laser interferometer according to claim 2, wherein the vibrator has a MEMS vibration mirror.

6. The laser interferometer according to claim 5, wherein the execution period of the demodulation process corresponds to the period of time in which a vibration velocity of the vibrator is maximum.

7. The laser interferometer according to claim 2, wherein the vibrator has a silicon resonator.

8. The laser interferometer according to claim 7, wherein the execution period of the demodulation process corresponds to the period of time in which a vibration velocity of the vibrator is maximum.

9. The laser interferometer according to claim 2, wherein the vibrator has a quartz crystal resonator.

10. The laser interferometer according to claim 9, wherein the execution period of the demodulation process corresponds to the period of time in which a vibration velocity of the vibrator is maximum.

11. The laser interferometer according to claim 2, wherein the execution period of the demodulation process corresponds to the period of time in which a vibration velocity of the vibrator is maximum.

12. The laser interferometer according to claim 1, wherein the vibrator is an element that has the light reflecting surface reflecting the first laser light and vibrates in an out-of-plane direction of the light reflecting surface.

13. The laser interferometer according to claim 12, wherein
the execution period of the demodulation process corresponds to the period of time in which a vibration velocity of the vibrator is maximum.

14. The laser interferometer according to claim 1, wherein the execution period of the demodulation process corresponds to the period of time in which a vibration velocity of the vibrator is maximum.

15. A control method for a laser interferometer, the control method comprising:
emitting first laser light toward an object;
receiving the first laser light via an opening of a light-shielding structure and modulating the first laser light to generate second laser light including a modulated signal by vibration of a vibrator and reflecting the first laser light from a light reflecting surface on the vibrator, wherein the modulated signal has a modulation frequency corresponding to the vibration of the vibrator, and the opening of the light-shielding structure selectively passes the second laser light as selectively passed second laser light;
receiving interference light between the selectively passed second laser light and third laser light including a sample signal to output a light reception signal, wherein the third laser light is generated by the first laser light on the object; and
selectively repeatedly performing a demodulation process to demodulate the sample signal from the light reception signal during only an execution period,
wherein the execution period corresponds to a period of time during which each crest of each waveform in the modulation frequency has a highest value and values that are substantially the same as the highest value,
a velocity of the light reflecting surface is substantially constant during the execution period,
an instantaneous vibration velocity of the vibrator is the largest during the execution period,
the vibrator is configured to perform a reciprocating motion rotating around a rotation axis of a torsion bar such that the light reflecting surface faces various directions with respect to a first optical axis of the first laser light, and
the selectively passed second laser light has a second optical axis aligned with the first optical axis of the first laser light.

* * * * *